United States Patent [19]
Komoda et al.

[11] Patent Number: 5,852,346
[45] Date of Patent: Dec. 22, 1998

[54] FORMING LUMINESCENT SILICON MATERIAL AND ELECTRO-LUMINESCENT DEVICE CONTAINING THAT MATERIAL

[75] Inventors: Takuya Komoda; Peter Layton Francis Hemment, both of Surrey, England

[73] Assignee: University of Surrey, England

[21] Appl. No.: 929,251

[22] Filed: Sep. 15, 1997

Related U.S. Application Data

[63] Continuation of Ser. No. 408,524, Mar. 22, 1995, abandoned.

[30] Foreign Application Priority Data

Mar. 24, 1994 [GB] United Kingdom .................... 9405870
Mar. 17, 1995 [GB] United Kingdom .................... 9505361

[51] Int. Cl.$^6$ ............................................. H01L 21/265
[52] U.S. Cl. .......................... 315/169.3; 437/24; 437/28; 437/29; 437/241
[58] Field of Search ................................ 437/24, 28, 29, 437/241; 315/169.3

[56] References Cited

U.S. PATENT DOCUMENTS

| | | | |
|---|---|---|---|
| 4,849,248 | 7/1989 | Hashimoto | 427/38 |
| 5,268,311 | 12/1993 | Euen et al. | 437/24 |
| 5,537,000 | 7/1996 | Alivisatos et al. | 313/506 |

FOREIGN PATENT DOCUMENTS 0 397 889  11/1990  European Pat. Off. .

OTHER PUBLICATIONS

INSPEC Abstract A 9508–6170T–023 & vol. 66, No. 7, pp. 851–853 Feb. 1995. Mutti et al "Room temperature visible luminescence etc".

INSPEC Abstract A 9508–8120N–008 & Materials synthesis and processing conference 1993 pp. 409–420. Materials Research Society USA, Atwater et al "Ion beam synthesis, etc".

INSPEC Abstract A 9324–7855–007 & Journal of Physics: Condensed Matter vol. 5, No. 31 pp. L375–L380 Aug. 1993. Shimizu–Iwayama et al "Visible photoluminescence related to Si precipitates".

K.V. Shcheglov et al., Visible Room–Temperature Photoluminescence From Ge and Si Nanocrystals in $SiO_2$ Formed By Ion–Implantation and Precipitation, Materials Research Society, 1993.

L.T. Canham, Silicon quantum wire array fabrication by electrochemical and chemical dissolution of wafers, Appl. Phys, Lett., 3 Sep. 1990, pp. 1046–1048.

*Primary Examiner*—Benny Lee
*Assistant Examiner*—Michael Shingleton
*Attorney, Agent, or Firm*—Armstrong, Westerman, Hattori, McLeland & Naughton

[57] ABSTRACT

A process is provided for forming a silicon material which exhibits room temperature photoluminescence and/or electroluminescence. It comprises the steps of implanting silicon ions into a silicon oxide ($SiO_2$) substrate and subsequently annealing the substrate at an elevated temperature for a period such as to bring about Si nanocrystal formation, the nanocrystals being dispersed through the $SiO_2$ substrate. Photoluminescence of visible light from the resulting substrate is induced on irradiation of the substrate with e.g. ultraviolet light, and the substrate can also be incorporated into an electroluminescent device. The process is characterised by the features of implanting silicon ions at a dose from $1\times10^{17}/cm^2$ to less than that required to produce saturation and by the use of an implantation energy of 100 keV or more. The resulting silicon nanocrystals dispersed through the $SiO_2$ substrate have an average particle size of about 30 Å.

19 Claims, 13 Drawing Sheets

FIG. 7
First Si ions implanting at 200 keV
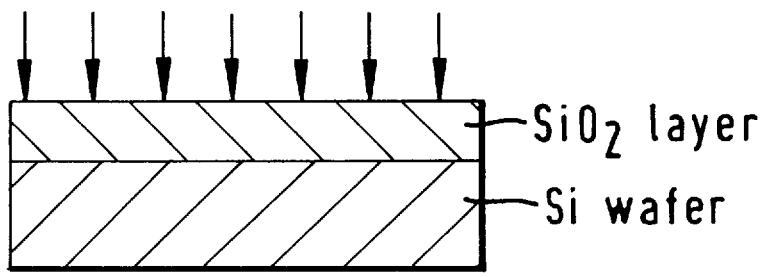
- SiO$_2$ layer
- Si wafer
Second Si ions implanting at 150 keV
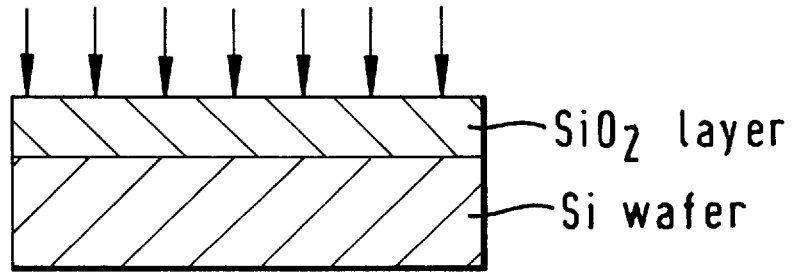
- SiO$_2$ layer
- Si wafer
Annealing
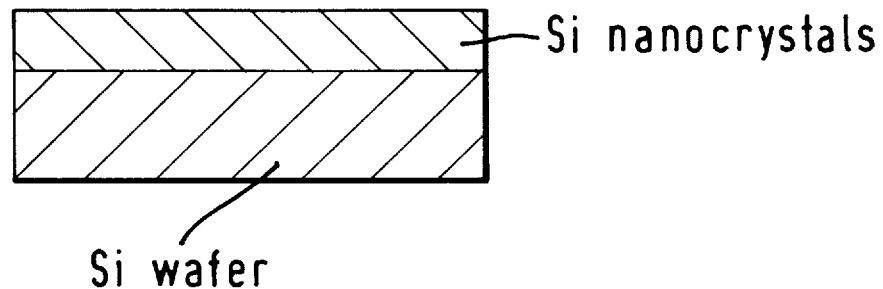
- Si nanocrystals
- Si wafer

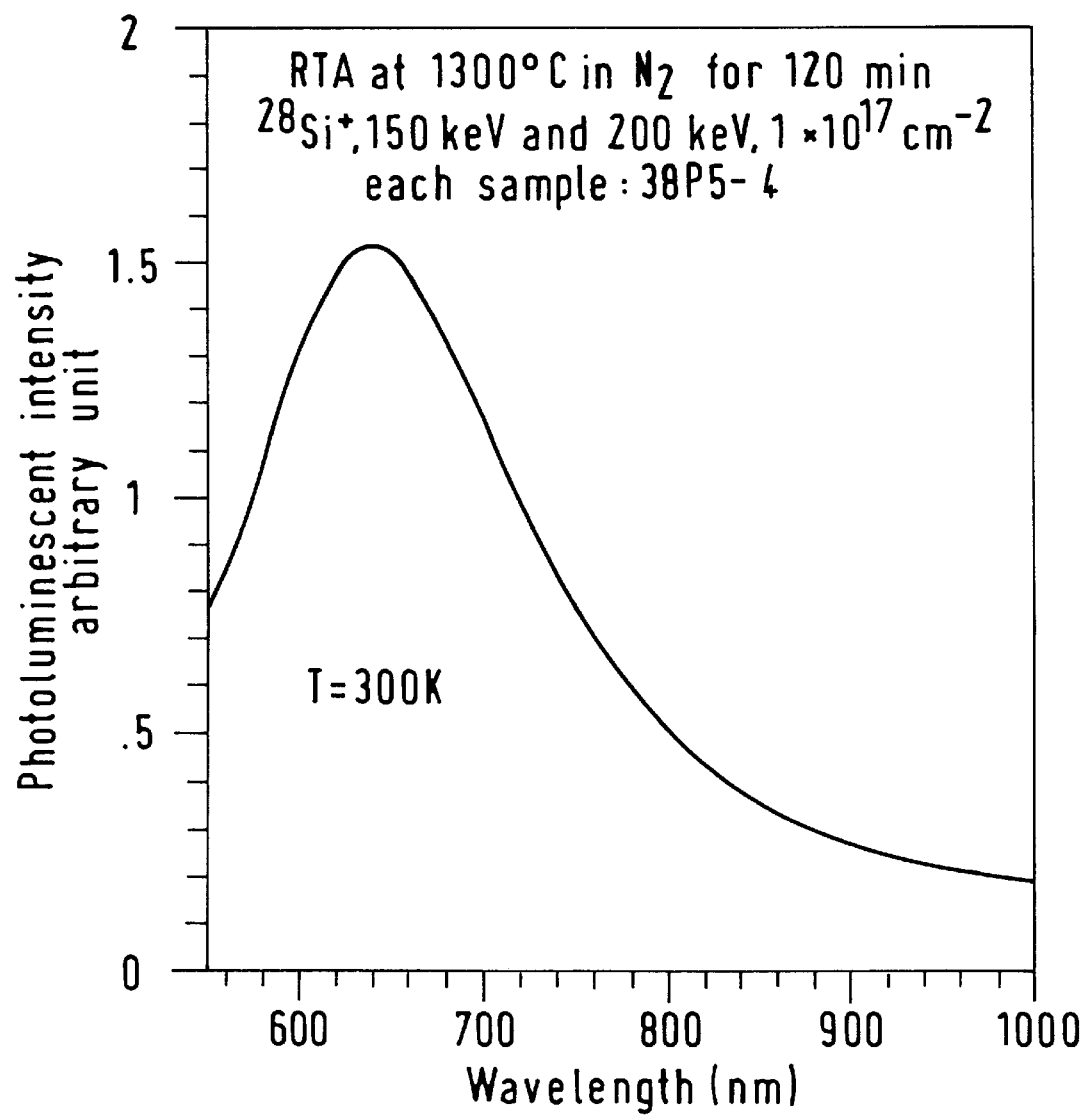

(a) 1300°C in $N_2$ for 300 min
Following (a) annealed in forming gas (800°C)
(b) 1 hour  (c) 2 hours  (d) 3 hours  (d) 4 hours (a) Annealed at 1300°C in $N_2$ for 30 min
Following (a) annealed in forming gas
(b) 400°C for 60 min
(c) 800°C for 60 min
(d) 1000°C for 60 min

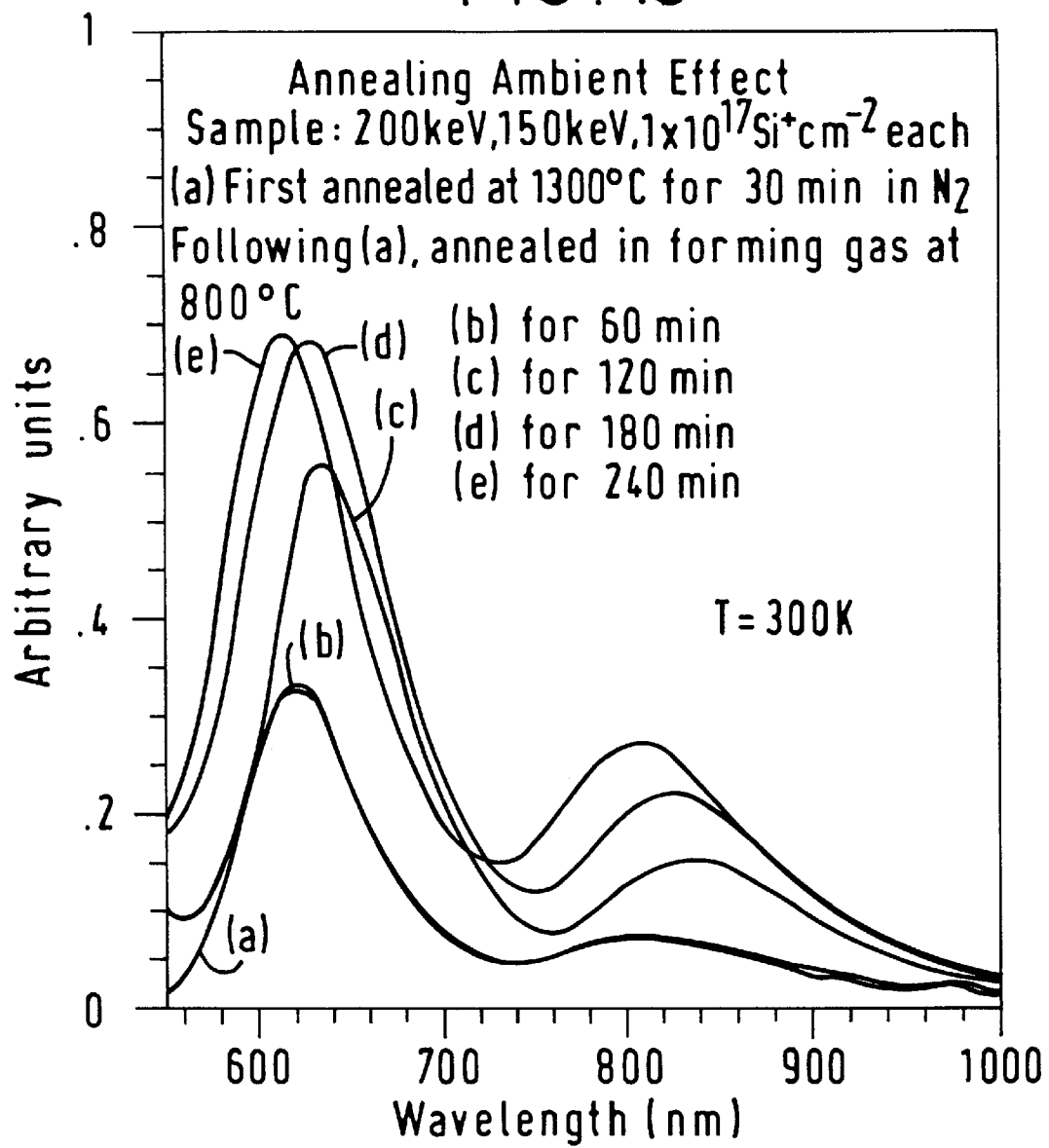

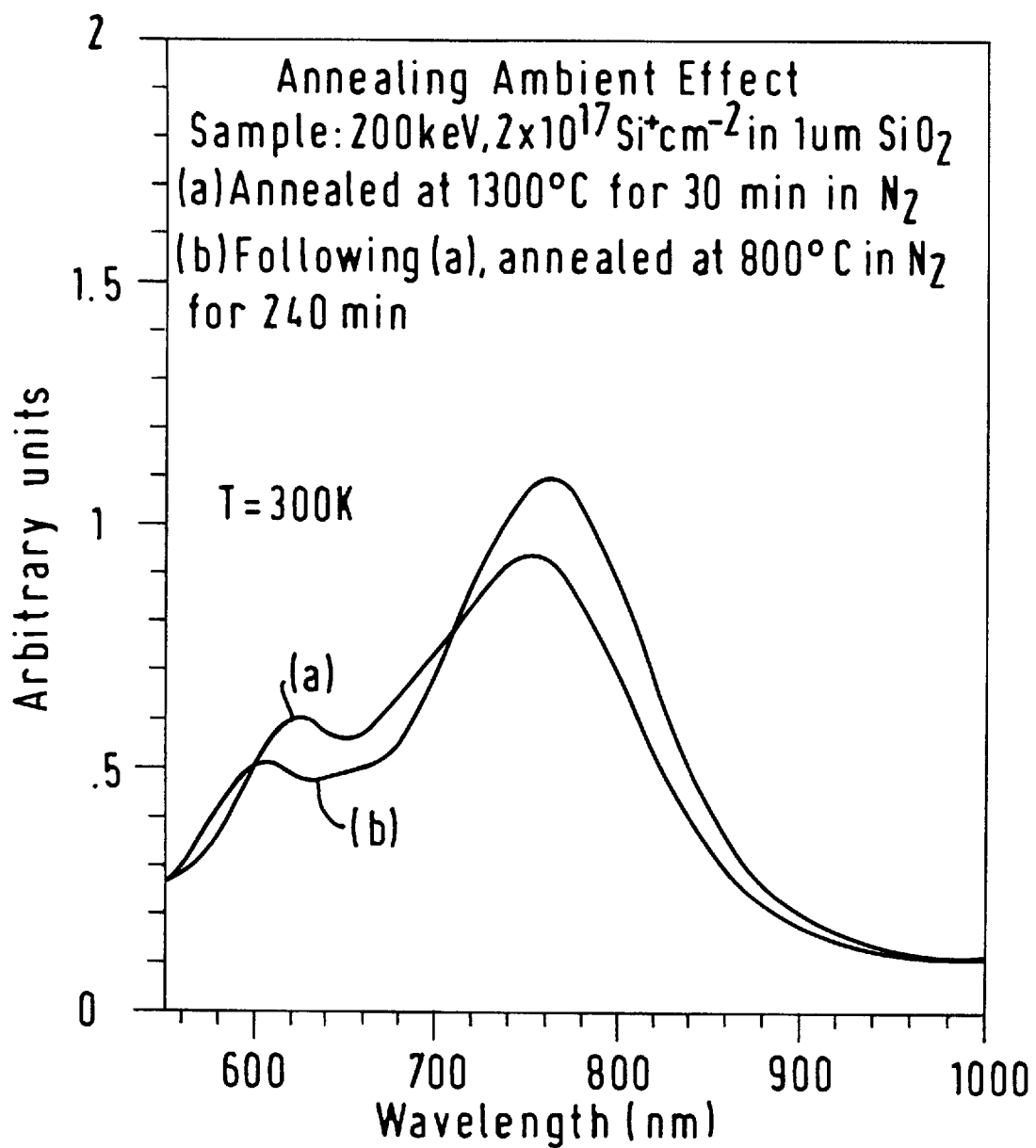

FORMING LUMINESCENT SILICON MATERIAL AND ELECTRO-LUMINESCENT DEVICE CONTAINING THAT MATERIAL

This application is a continuation of application Ser. No. 08/408,524 filed Mar. 22, 1995, now abandoned.

FIELD OF THE INVENTION

The present invention is concerned with a process of forming a luminescent silicon material which exhibits a visible photoluminescence or electroluminescence at room temperature when stimulated e.g. by ultraviolet radiation or by an applied electrical potential. The invention further is concerned with a method for treatment of a photoluminescent or electroluminescent substrate containing silicon nanocrystals in $SiO_2$ in order to improve the luminescence thereof. The invention is also concerned with an electroluminescent device which incorporates silicon material as aforesaid.

BACKGROUND TO THE INVENTION

A variety of light emitting devices using semiconducting electroluminescent compounds have been widely used in industry. The compounds and alloys used in such devices have been, for example, Ga—As, Ga—Al—As and In—P. Although such electroluminescent semiconducting compounds can produce radiation of relatively high intensity, they have relatively poor thermal stability, no stable oxide and are susceptible to fracture and therefore are difficult to process. Furthermore it is difficult to use established production methods for silicon integrated circuits in order to incorporate on such a silicon substrate both such an electroluminescent semiconducting compound and the appropriate control devices for control of the electroluminescence. In view of the above difficulties, a need has been identified for a light emitting device which can be formed in a silicon substrate together with the associated circuits.

L. T. Canham has recently reported (Appl.Phys. Lett., Vol 57, No 10, Sep. 3, 1990) that so called "mesoporous silicon layers" (pore width 20–500 Å) emit red photoluminescence at room temperature when illuminated with green or blue laser light. The process disclosed by Canham involves anodizing a silicon wafer in aqueous hydrofluoric acid so as to form the surface of the wafer into a porous silicon structure containing silicon quantum wires. This minute pore structure is believed to give rise to interband transitions of silicon that have not been possible in bulk crystalline silicon, and are responsible for the photoluminescence. However, since Canham discloses a wet process using electrochemical and chemical dissolution of the silicon wafer, it is difficult to adjust the porosity of the silicon and thereby obtain a particular luminescent colour. Furthermore, a silicon wafer having such a porous silicon structure is brittle and readily fractured. Accordingly, this process for making photoluminescent silicon is not satisfactory both from the standpoint of the ability to produce a particular desired color and from the standpoint of compatibility with other conventional techniques for making integrated circuits.

An alternative process for making photoluminescent silicon has been reported by H. A. Atwater et al in a paper entitled "Ion-beam synthesis of Luminescent Silicon and Germanium Nanocrystals in a Silicon Dioxide Matrix" given at the meeting of the Materials Research Society (MRS), Nov. 30, 1993 in Boston, USA. That report discloses a process for forming silicon nanocrystals in a $SiO_2$ matrix by ion implantation. In this process, the $SiO_2$ film is implanted with Si at a dose of $1\times10^{16}/cm^2$ to $5\times10^{16}/cm^2$ and is subsequently annealed to induce precipitation of Si nanocrystals having diamond structure and diameter 3 nm(30 Å). However, the ion implantation energy used can give rise to significant sputtering of the surface of the $SiO_2$ layer, which can result in surface erosion. Furthermore, the profile of ion implantation in silicon dioxide films is controlled by the kinetics of ion stopping. Using low energy ion beams the ions become implanted in a surface region which is subject to sputter, so that it is difficult to produce high concentrations of implanted ions and reproducible concentration-depth profiles, and the dose of ions which is effectively implanted in the layer may be limited by the sputter rate. Furthermore, the $SiO_2$ film used by Atwater et al had only a limited capacity for implanted ions because of it low thickness (100 nm).

SUMMARY OF THE INVENTION

This invention provides a process of forming a luminescent silicon material which comprises the steps of implanting silicon ions into a substrate of silicon oxide ($SiO_2$), annealing the substrate at an elevated temperature for a predetermined period of time so as to precipitate and grow nanocrystals of silicon which are dispersed in the $SiO_2$ and can photoluminesce visible light at room temperature, the process being characterised in that the silicon ions are implanted at an energy of at least 100 keV and at a dose of from $1\times10^{17}$ $cm^2$ upto that required to produce sputter-limited saturation.

The above process enables photoluminescent devices to be formed in silicon material. In some embodiments it enables the characteristics of the colour to be controlled. It gives rise to a material having photoluminescence characteristics which are stable over an extended period of time, and it is compatible with other techniques used in integrated circuit manufacture.

The resulting crystallites in an oxide matrix can exhibit visible photoluminescence at room temperatures upon irradiation with light e.g. UV light. It may also exhibit photoluminescence when incorporated into an electronic device.

The invention also provides a process of forming a luminescent silicon material which comprises the steps of implanting silicon ions into a silicon oxide ($SiO_2$) substrate and annealing the substrate at an elevated temperature for a period sufficient to bring about precipitation and growth of nanocrystals of silicon dispersed through the $SiO_2$ substrate and capable of exhibiting photoluminescence or electroluminescence, the process being characterised in that the thickness of the silicon dioxide layer is more than 100 nm and the silicon dioxide layer is implanted with ions having an energy sufficient to penetrate the $SiO_2$ layer with a projection range equal to or more than half the thickness of the $SiO_2$ layer.

In a further aspect, the invention provides a method of treatment of a substrate which may be a $SiO_2$ layer containing luminescent Si nanocrystals in order to increase the luminescent response of the substrate, said method comprising treating the material with hydrogen or fluorine at elevated temperatures. The treatment may be, for example, an annealing treatment subsequent to a nanocrystal growth step in an atmosphere of a hydrogen containing gas such as forming gas ($N_2+H_2$) at a temperature of about 800°–1000° C. for 30 minutes or more and preferably 1 hour or more. The forming gas may be 85–95% $N_2$ and 5–15% $H_2$. The ability of hydrogen post-annealing to increase luminescent response was unexpected and similar improvement in luminescent response is not obtained when post-annealing is carried out in an inert atmosphere ($N_2$).

The invention further provides an electroluminescent device which comprises a conductive substrate, a silicon dioxide layer on the substrate, said silicon dioxide layer containing dispersed nanocrystals of silicon which exhibit electroluminescence, and an upper layer of crystalline silicon, at least one of the upper and lower layers being doped so as to form therein a driver circuit by which an electric field can be applied across the $SiO_2$ layer in order to give rise to electroluminescence.

DISCUSSION OF PREFERRED FEATURES

Preferably the substrate is annealed at a temperature of 900° to 1300° C. for 15 minutes to 6 hours.

In a further preferred form of the invention, the implantation of the silicon ions is divided into two or more separate steps conducted under different conditions. For example, in a first such step the silicon ions can be implanted into the $SiO_2$ substrate at a first acceleration energy and in subsequent implantation steps the acceleration energy can be made different from the first acceleration energy. This technique enables silicon dioxide to be implanted at relatively large doses over a relatively large range of depths with generally uniform distribution of ions. It therefore enables the resulting Si nanocrystals to be distributed in a generally uniform manner through the depth of the substrate and to have a more uniform particle size so that the band of wavelengths of the emitted light from the silicon nanocrystals is narrowed and it is easier to obtain light of a desired colour. The crystal size itself can be adjusted by varying the ion dose and annealing conditions.

The $SiO_2$ substrate may be formed by oxidation of a monocrystalline silicon wafer, or alternatively as a separate plate of quartz.

BRIEF DESCRIPTION OF THE DRAWINGS

Various embodiments of the invention are described with reference to the accompanying drawings in which:

FIG. 7 is a schematic view showing a further embodiment of the process for forming photoluminescent silicon material;

FIG. 9 is graph showing for material obtained by the process of FIG. 7 the photoluminescence characteristics of the silicon material; FIGS. 11–14 are graphs showing luminescence intensity against wavelength for further material made by the process of the invention.

DETAILED DESCRIPTION OF PREFERRED EMBODIMENTS

Figure 1:
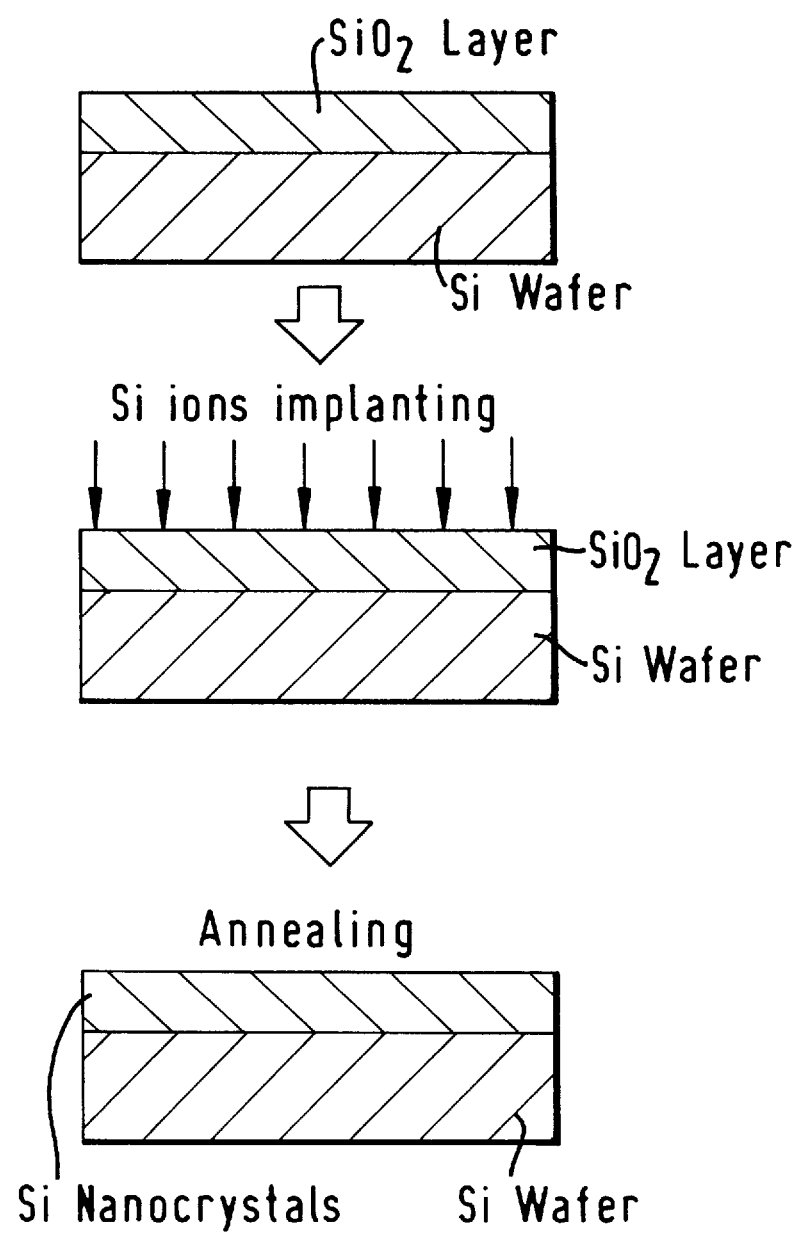
FIG. 1 is schematic view illustrating a process for forming photoluminescent silicon material in accordance with a preferred embodiment of the present invention.

FIG. 1 depicts a process in accordance with a first form of the present invention. The process comprises the following steps:

(a) A silicon wafer 1 is oxidised to form a $SiO_2$ substrate layer on an exposed surface of the silicon wafer.

(b) Si ions are implanted into the $SiO_2$ layer 2 at a dose of from $1\times10^{17}/cm^2$ to less than that required to produce saturation. The ion acceleration energy is such that the Si projection range (Rp) is maintained within the thickness of the $SiO_2$ layer 2. It has been found that suitable acceleration energies range from 100 keV upwards.

(c) The resulting wafer implanted with silicon ions is annealed at an elevated temperature for a predetermined time in order to bring about precipitation of Si nanocrystals.

By the above process, the implanted silicon ions are caused to precipitate within the $SiO_2$ layer 2 in the form of nanocrystals having an average particle size of about 30 Å. The nanocrystals thus precipitated are dispersed in the $SiO_2$ substrate and exhibit room temperature photoluminescence when excited by a beam of light from a laser.

The following examples further illustrate the invention.

EXAMPLE 1

A wafer of p-type silicon 500 μm thick and having a resistance of 2 to 3 Ωcm was wet oxidised to form on its exposed surface a layer of $SiO_2$ 5000 Å thick which acts as a substrate for ion implantation. The resulting specimen was mounted on an aluminum plate which acted as a heat sink and was implanted with $^{28}Si^+$ ions at a dose of $6\times10^{17}/cm^2$ at room temperature using a 500 keV capacity heavy ion accelerator operated at an acceleration voltage of 200 keV. This accelerator was a conventional device having a single acceleration stage after ion extraction and before momentum analysis. The specimen was uniformly implanted using electrostatic X-Y beam scanning at frequencies of 380 Hz and 61 Hz, and the ion dose was determined by integration of the incident beam current. The specimen was implanted with instantaneous currents in the range of 5 to 20 μA with a mean spot size of about 3 mm×5 mm. Under these implantation conditions, the specimen was found to have a mean projected range (Rp) of the silicon ions in $SiO_2$ which is 3000 Å and the half width σ is about 700 Å. This indicates that substantially all of the implanted $Si^+$ ions remain as atoms within the $SiO_2$ layer.

The specimen was subsequently annealed in a nitrogen atmosphere using a rapid thermal annealing (RTA) device at a temperature of 1300° C. for 30 minutes. The device was operated so that the annealing temperature of 1300° C. was reached in about 1 minute. After annealing for the above defined period, the specimen was allowed to stand in order for natural cooling to take place.

Figure 2:
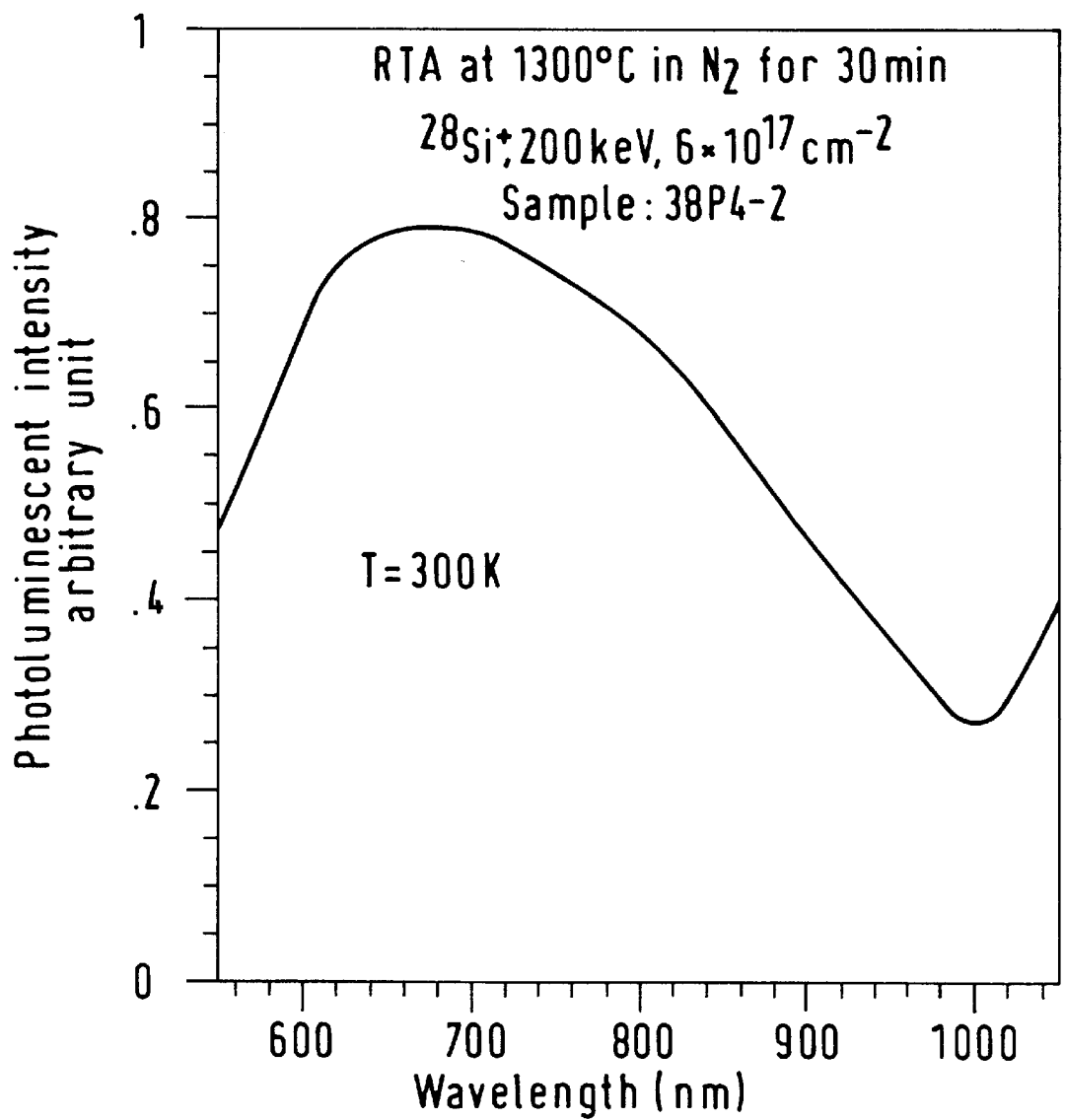
FIGS. 2 to 6 are graphs illustrating photoluminescence characteristics of the silicon material made according to the process of FIG. 1 in the examples set out below under a variety of different Si ion implantation conditions and annealing conditions.

The photoluminescence of the resulting specimen was examined by irradiating it with laser light of wavelength 488 nm at an ambient temperature of 27° C. (300° K). The results are shown in FIG. 2 and it is apparent that the photoluminescence spectrum has a peak in the visible range below 770 nm. Photoluminescence is believed to occur due to quantum confinement within silicon precipitates which are formed through the conversion of isolated silicon atoms into covalently bonded nanocrystals during the annealing process. If this did not happen, the Si ions implanted would remain randomly distributed within the amorphous $SiO_2$ layer. The resulting Si nanocrystals have a particle size of 30 Å or less and are believed to exhibit quantum effects on the band structure of the silicon giving it the capacity to photoluminesce and to emit light in the visible range. It has been found that even when large amounts of silicon ions are implanted into the $SiO_2$ layer, the recrystallisation of the silicon proceeds gradually, and that there is no abrupt increase in the speed of recrystallisation at elevated temperatures. It is therefore possible to select the size developed by the silicon crystals so as to produce radiation of a desired colour, i.e. the wavelength of the emitted radiation can be adjusted by controlling the annealing temperature and time.

EXAMPLE 2

Figure 3:
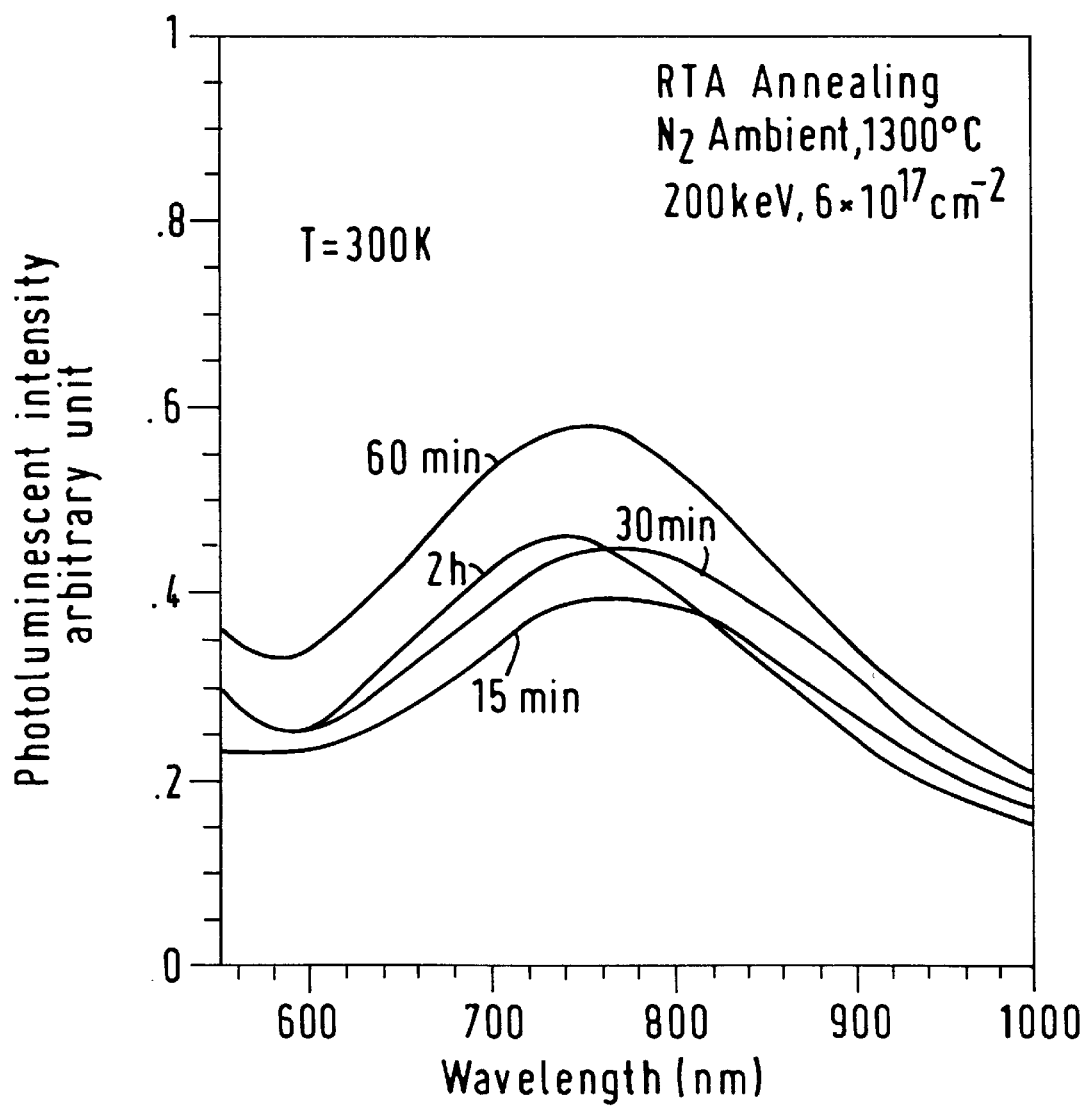

The procedure of Example 1 was followed using annealing times of 15 minutes, 30 minutes, 60 minutes and 120 minutes. After annealing for the above specified period the samples were allowed to cool naturally. Photoluminescence of the resulting specimens was examined using laser light at 488 nm at a temperature of 27° C. (300° K). The results are shown in FIG. 3 from which it is apparent that the photoluminescence wavelength peak varies in position depending on the annealing time so that the wavelength maximum intensity can be selected by selection of the annealing time.

EXAMPLE 3

Figure 4:
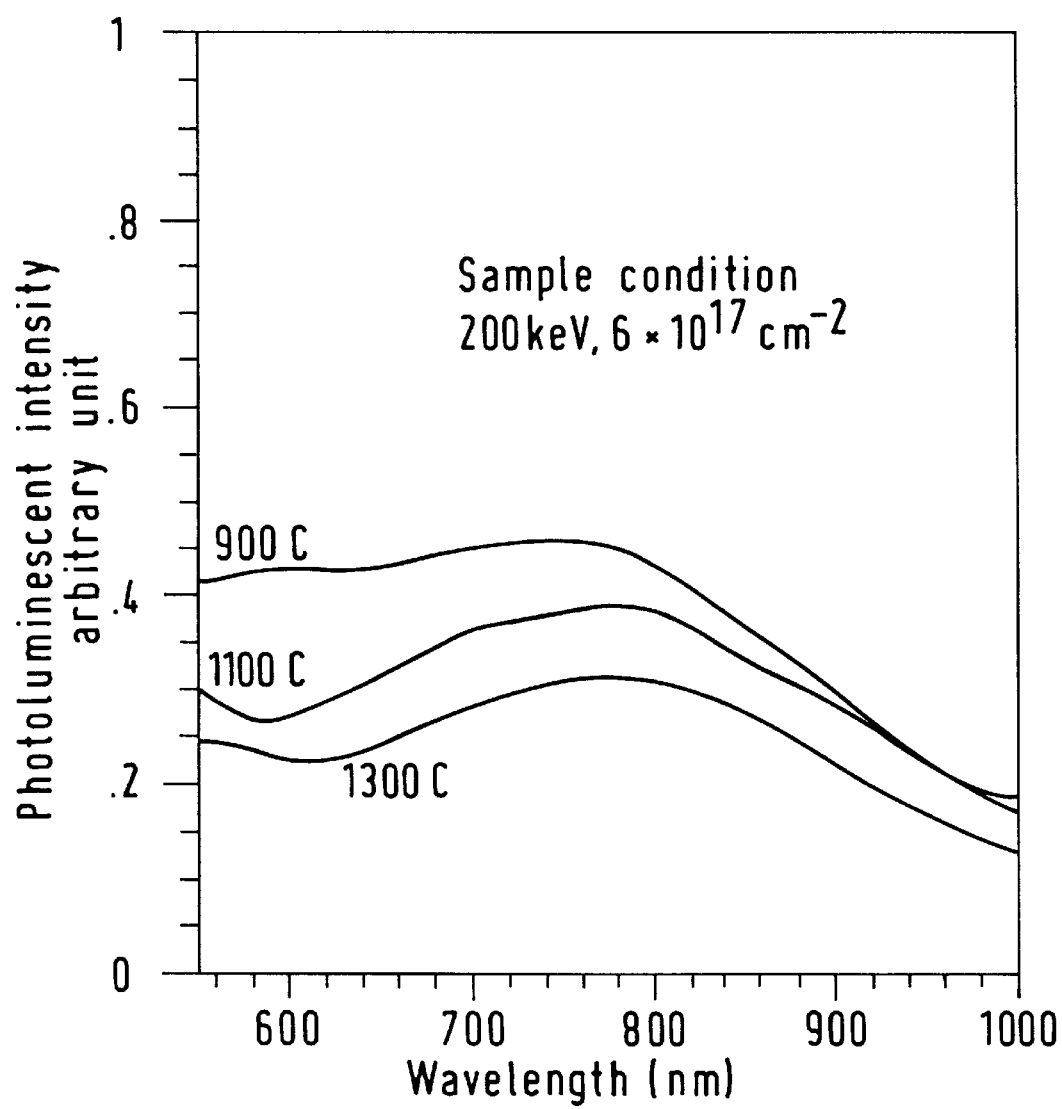

The procedure of example 1 was repeated except that the annealing time was 30 minutes and the annealing temperature was 900° C., 1100° C. and 1300° C. Specimens were tested for photoluminescence in the same way as in Example 1. The results are shown in FIG. 4 from which it is apparent the photoluminescence occurs over a broad range of wavelengths for the specimen annealed at 900° C., but that a peak in the spectrum appears as the annealing temperature is increased. Accordingly, it is apparent that the specimen can be caused to have a photoluminescence peak at a desired wavelength by appropriate selection of the annealing temperature.

EXAMPLE 4

Figure 5:
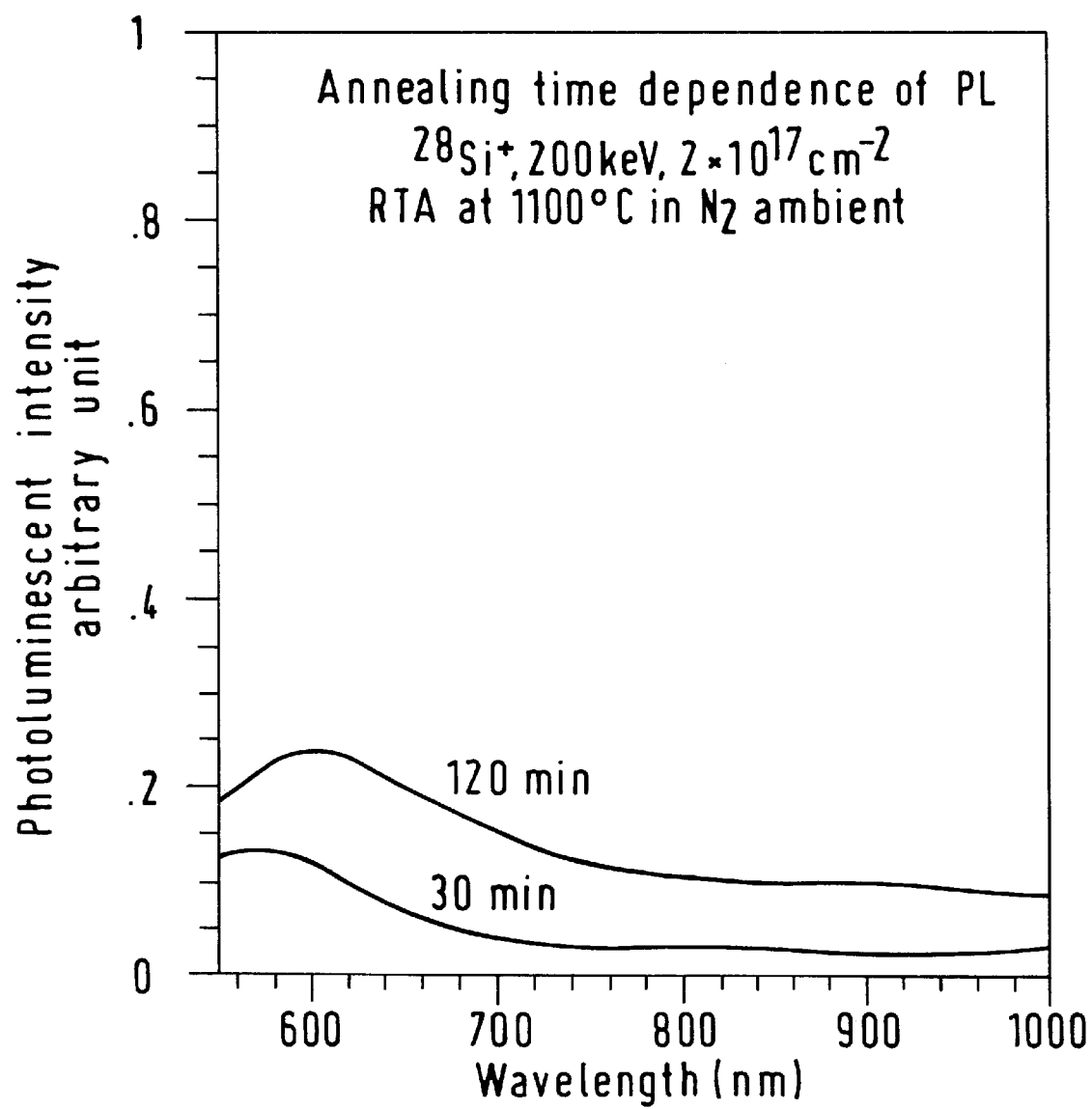

The procedure of Example 1 was repeated for two samples except that they were implanted at a dose of $2 \times 10^{17}/cm^2$ and then annealed at 1100° C. for 30 minutes and 120 minutes respectively. The photoluminescence of the two specimens was examined as in Example 1 and the results are shown in FIG. 5 from which it is apparent that the specimen which had been annealed for 120 minutes showed a photoluminescence peak at 660 nm which is more well defined and more intense than that of the specimen which had been annealed for thirty minutes.

EXAMPLE 5

Figure 6:
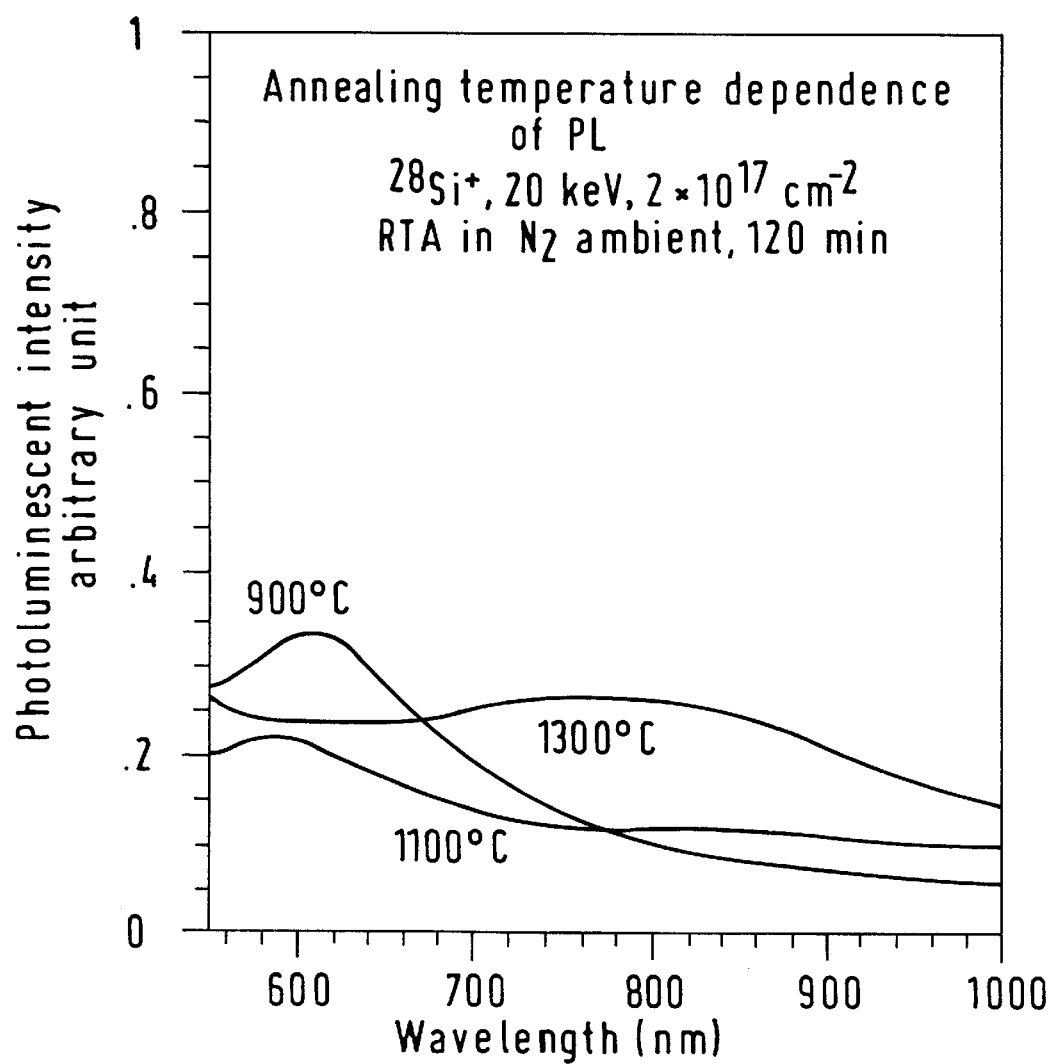

The procedure of Example 4 was repeated except that the annealing period was maintained at 120 minutes and specimens were annealed at 900° C., 1100° C. and 1300° C. respectively. The photoluminescence of the specimens was measured as in Example 1 and the results are shown in FIG. 6 from which it is apparent that the specimen annealed at 900° C. exhibited the highest intensity photoluminescence peak. It is therefore presumed that annealing at 900° C. is best for a silicon wafer implanted with $Si^+$ ions at a dose of $2 \times 10^{17}/cm^2$. Furthermore, the specimen annealed at 900° C. according to this example exhibits an intensity peak which is shifted towards the blue when compared with the specimens in Examples 1 to 3 which were implanted at a dose of $6 \times 10^{17}/cm^2$. It is therefore possible to adjust the colour or wavelength of the photoluminescence by appropriate selection of the implantation dose and the annealing temperature in addition to the annealing time.

EXAMPLE 6

This example shows a second form of the process of the invention which is shown in FIG. 7 and in which Si ions are implanted in two stages at different acceleration energies into a single $SiO_2$ layer 2A in the upper surface of a Si wafer 1A.

Figure 8:
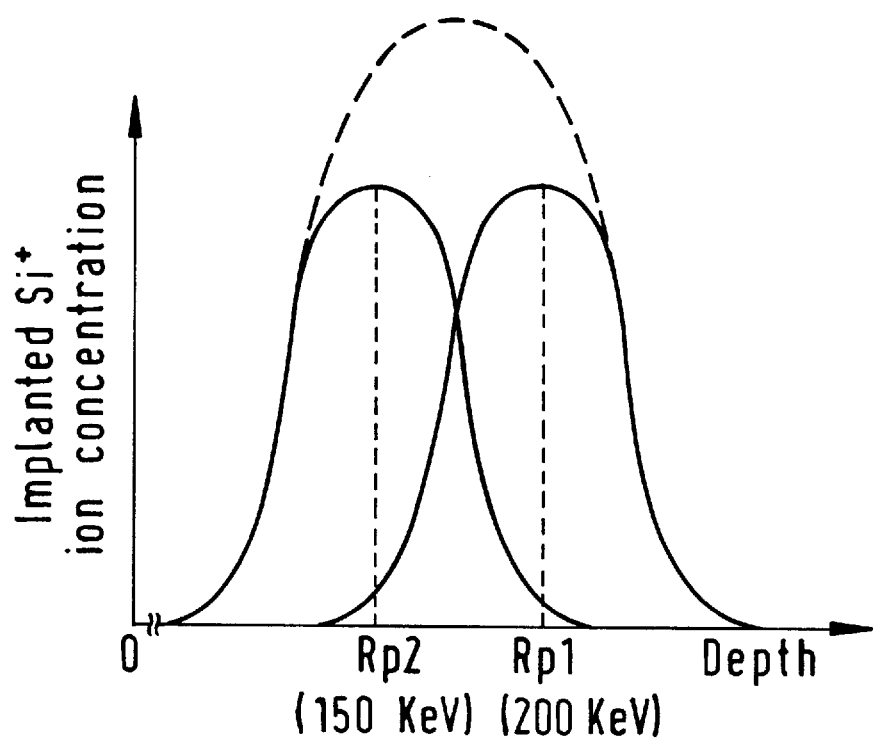
FIG. 8 is a graph showing for separate implantation of silicon ions at different acceleration energies in the process of FIG. 7 the relationship between the density of the implanted silicon ions and the depth within the $SiO_2$ substrate.

A silicon wafer specimen was prepared as described in Example 1 and was implanted with $^{28}Si^+$ ions firstly at an ion acceleration energy of 200 keV and subsequently implanted with additional $^{28}Si^+$ ions at an acceleration energy of 150 keV, each at a dose of $1 \times 10^{17}/cm^2$. The different ion acceleration energies used give rise to different projection ranges [Rp] of the Si ions within the thickness of the $SiO_2$ substrate as shown in FIG. 8, where $Rp_1$ presents the projection range of Si ions implanted at 150 keV and $Rp_2$ represents the projection range at 200 keV. The resulting $SiO_2$ substrate containing $Si^+$ ions implanted at projection ranges $Rp_1$ and $Rp_2$ was annealed in a nitrogen atmosphere at a temperature of 1300° C. for 120 minutes using the same RTA device as in the previous examples, thereby causing Si nanocrystals to precipitate and grow in the $SiO_2$ matrix. The resulting specimen was found to exhibit photoluminescence when illuminated by laser light at 488 nm at an ambient temperature of 27° C. (300° K.). The resulting photoluminescence spectrum is shown in FIG. 9 from which it is apparent that the specimen has a fluorescence peak at a relatively limited range of wavelengths compared to that shown in FIGS. 2 to 6 for the specimens of Examples 1 to 5. It is therefore apparent that the two step ion implantation gives rise to a narrow range of emitted wavelengths and therefore facilitates the obtaining of a different colour.

It is believed that the reason for this narrowing in the range of emitted wavelength is because of the formation of a relatively constant concentration of Si ions implanted into the $SiO_2$ layer due to the two step implantation. The production of Si ions dispersed uniformly over a wide range of depth in the $SiO_2$ matrix means that the Si ions become transformed into Si nanocrystals, a large proportion of which are also distributed uniformly over a wide range of depths and have uniform particle size which is believed to be the factor which determines the luminescent wavelength. Accordingly material having a desired fluorescent wavelength can be produced by appropriate selection of ion dose and the annealing conditions which adjusts the particle size of the silicon nanocrystals. It will be appreciated that the above procedure may be modified to use a continuous distribution of ion energies rather than two or more energies that are maintained constant in distinct stages.

Figure 10:
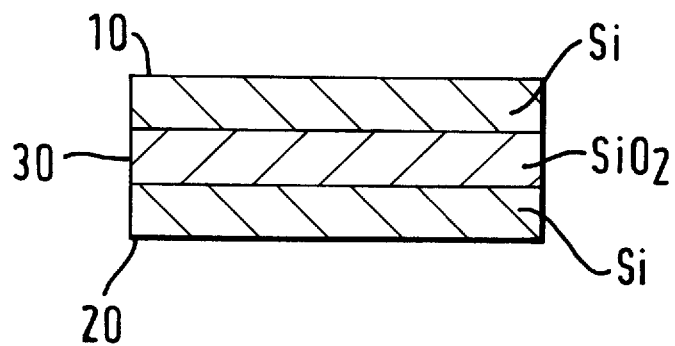
FIG. 10 is a schematic view of a light emitting device in accordance with a further embodiment of the present invention.

The resulting $SiO_2$ layer containing dispersed Si nanocrystals can be used in a variety of different device structures, and for example the layer can exhibit electroluminescence under appropriate conditions. One typical example is an electroluminescent device for use in the field of optical transmission and which emits visible light. FIG. 10 shows such a device which is configured into a heterostructure as a silicon on insulator (SOI;SIMOX) structure composed of an upper silicon layer 10, a lower silicon layer 20 and an intermediate $SiO_2$ layer 30. In this structure $Si^+$ ion implantation is used to form a silicon rich buried $SiO_2$ layer 30 in which the concentration and distribution of Si can be adjusted by an appropriate selection of ion doses and energies. Si crystallites grow during subsequent high temperature annealing. The structure shown in FIG. 10 can be annealed at temperatures upto the melting point of silicon. At least one of the upper and lower crystalline silicon layers 10, 20 can be doped to permit fabrication of the necessary driving circuit which applies an electric field to cause the $SiO_2$ layer 30 to electroluminesce.

Although the foregoing examples use an $SiO_2$ layer formed by oxidation of the upper surface of an Si wafer, it is also possible to use a separate quartz plate into which Si ions are implanted and which is subsequently annealed under the same conditions as above.

EXAMPLE 7

A p-type silicon wafer of 500 $\mu$m thickness and 2–3 $\Omega$cm resistivity was wet oxidised in order to grow a thermal oxide ($SiO_2$) layer. The thickness of the $SiO_2$ layer was 1 $\mu$m and it acted as the host for the implanted Si ions. The silicon wafer was mounted on an aluminium plate which acted as a heat sink and was implanted with 200 keV $^{28}Si^+$ ions to a dose of $2\times10^{17}/cm^2$ at room temperature. The implantation was carried out in a conventional implanter using single charged ($Si^+$) ions with instantaneous currents in the range of 5 to 20 $\mu$A and with a mean spot size of about 3 mm×5 mm. The implanter had a single acceleration stage and the ion beam was momentum analysed at the full kinetic energy. The sample was uniformly implanted using electrostatic X-Y beam scanning at frequencies of 38 Hz and 61 Hz and the ion dose was determined by integration of the incident beam current. The 200 keV $Si^+$ ions had a mean projected range (Rp) in $SiO_2$ of about 3000 Å and a half width $\sigma$ of about 700 Å. Sputtering was not a limiting process under these implantation conditions and substantially all the implanted $Si^+$ ions came to rest as atoms within the $SiO_2$ layer.

The samples were subsequently annealed at a temperature of 1300° C. for 30 minutes in a nitrogen atmosphere, using a rapid thermal annealing (RTA) system operated so that the annealing temperature of 1300° C. was reached in about 2 minutes. After they had been annealed, the samples were allowed to cool naturally.

Subsequently, a second sequential annealing procedure was carried out in a forming gas atmosphere (10% $H_2$ and 90% $N_2$) using the same RTA equipment at a temperature of 800° C. for discrete 60 minutes anneals which gave total times at temperature of 60, 120, 180 and 240 minutes. The actual experiment was carried out on a single sample. Therefore (1) the sample was first annealed at 1300° C. for 30 minutes in a nitrogen atmosphere and the photoluminescence spectrum was taken at this point [spectrum a]. (2) The sample was subsequently annealed at 800° C. for 60 minutes in forming gas and the photoluminescence spectrum was taken at this point [spectrum b]. (3) Subsequently the sample was put into the furnace and was annealed at 800° C. for a further 60 minutes in forming gas, that is a total annealing time of 120 minutes at 800° C. and the photoluminescent spectrum was taken at this point [spectrum c]. (4) Subsequently, the sample was put into the furnace again and annealed at 800° C. for a further 60 minutes in forming gas, that is a total annealing time of 180 minutes and the photoluminescent spectrum was taken at this point [spectrum d]. (5) Subsequently, the sample was put into the furnace again and annealed at 800° C. for yet a further 60 minutes in forming gas, that is a total annealing time of 240 minutes and the photoluminescent spectrum was taken at this point [spectrum e]. However, the inventors believe that the same results could be achieved using 5 different samples annealed continuously for the periods indicated.

Figure 11:
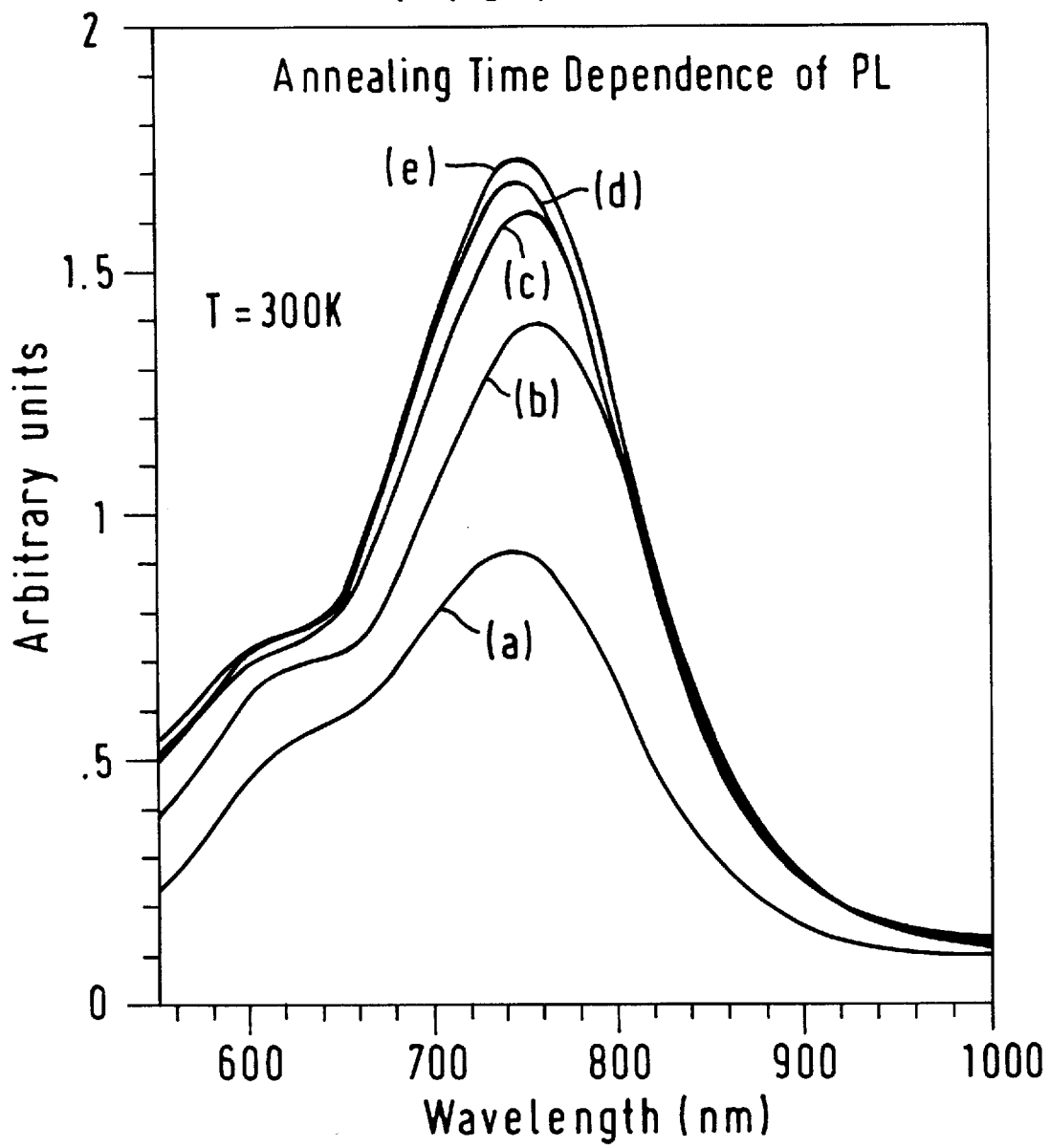

The photoluminescence emission at room temperature (300° K.) from those samples was examined by irradiating them with argon laser light at a wavelength of 488 nm. FIG. 11 shows photoluminescence spectra from samples where curve (a) is the spectrum after the first anneal in $N_2$ gas and (b) to (e) are the spectra from the sample after subsequent anneals at 800° C. for total time of 60, 120, 180 and 240 minutes. It is apparent that the luminescent intensity at the peak wavelength, measured after each anneal step, is increasing with anneal time.

EXAMPLE 8

Figure 12:
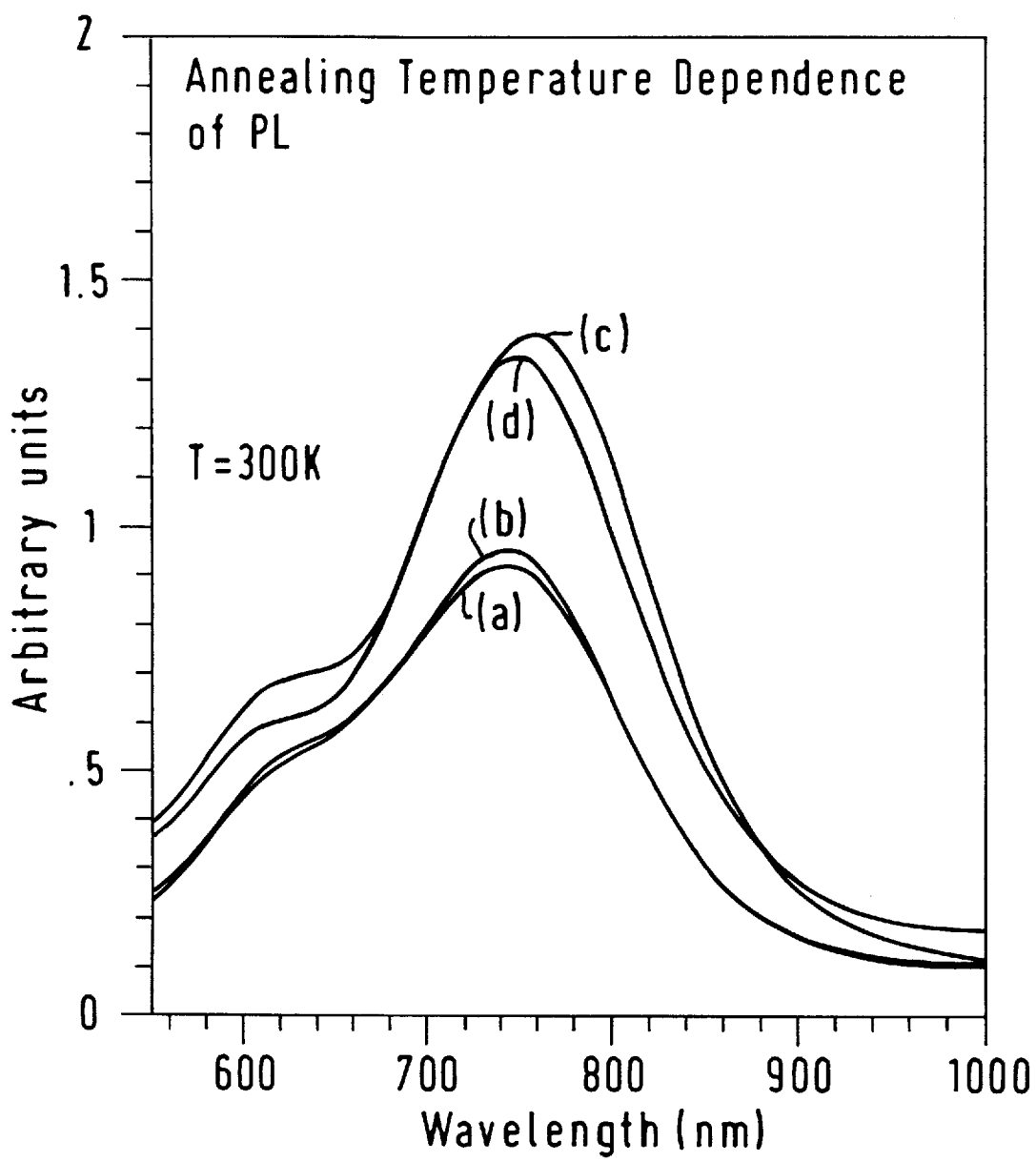

The procedure of example 7 was followed but, in this case, the second anneal in an atmosphere of forming gas was at temperatures of 400° C., 800° C. and 1000° C. After annealing, the samples were allowed to cool naturally. FIG. 12 shows the photoluminescence spectra recorded from the samples and it is evident that the enhancement is highly sensitive to temperature, there being only a small effect at 400° C., whilst the effect appears to saturate or is even diminished during a 1000° C. anneal.

EXAMPLE 9

The procedure in example 7 was followed but, on this occasion, the sample was implanted with a different dose and at two energies. A n-type silicon wafer of 500 $\mu$m thickness and having 2–4 $\Omega$cm resistivity was wet oxidised to form a 1 $\mu$m thick $SiO_2$ layer on its exposed surface which acted as the host for the implanted Si ions. The samples were mounted on an aluminium plate, as before, and implanted with a dose of $1\times10^{17}$ $^{28}Si^+$ $cm^{-2}$ at energies of 200 KeV and 150 keV. The different ion energies gave rise to different projection ranges (Rp), namely 3000 Å and 2250 Å for the 200 keV and 150 keV ions respectively. Therefore, the excess Si has a lower volume concentration although the areal density was the same as in example 7. $SiO_2$ matrix has the proportion of one Si atom and two oxygen atoms. If $Si^+$ ions are implanted from outside into the $SiO_2$ layer, the implanted Si will be "the excess Si" which will have an approximately Gaussian depth distribution. The excess Si can be defined in terms of a concentration—depth profile, the integral of which gives the real density (ions $cm^{-2}$). Using these samples, the anneal procedure in example 7 was carried out. FIG. 13 shows the photoluminescent spectra recorded after each anneal stage. It is evident that in those samples, which have emission at a different wavelength, the intensity of the photoluminescence is increased as a result of annealing in forming gas.

EXAMPLE 10

The procedure in example 7 was carried out but, in this case, the second anneal at 800° C. was in a nitrogen atmosphere instead of forming gas. FIG. 14 shows the photoluminescent spectra from the sample where spectrum (a) is from a sample annealed at 1300° C. for 30 minutes in $N_2$, and where spectrum (b) was recorded after a further anneal in a nitrogen atmosphere at 800° C. for 240 minutes. It is evident that annealing at 800° C. in the nitrogen atmosphere only has a very small effect upon the luminescence intensity.

The experiments described in Examples 7–10 demonstrate that thermal processing of $SiO_2$/Si structures formed by the present process in a forming gas atmosphere systematically enhances the photoluminescence intensity by a factor of up to two. We believe that this effect is due to the diffusion of hydrogen into the $SiO_2$ and subsequent attachment to dangling bonds associated with the local interfaces of the Si nanocrystals in the $SiO_2$ matrix. This is considered to be a reasonable presumption as hydrogen is known to modify the optical and electrical properties of amorphous and polycrystalline silicon, which contain many dangling bonds ["Amorphous Silicon Technology—1993", Mat. Res. Soc. Symp. Proc. 297, 1993, ed Eric A Schiff et al, Materials Research Society. Pittsburg]. Further, the above mentioned study and also a further study ["Rare Earth Doped Semiconductors", Mat. Res. Soc. Symp, Proc., 301, 1993, ed Gennot S Pomreke et al, Materials Research Society Pittsburg] of the luminescence from silicon based systems, such as amorphous silicon or rare earth doped silicon, show the high sensitivity of the luminescence intensity to the presence of impurities. Whilst the mechanisms responsible for the luminescence will differ between the materials, it is the balance between the radiative and non-radiative recombination pathways that control the luminescence intensity. If there are more non-radiative recombination pathways than radiative recombination pathways, then good luminescent intensity is not obtained because all the free carriers (electrons and holes) will be annihilated and lose their energy without the emission of a photon (in this case no photoluminescent emission). Thus, the presence of impurity atoms which can bring about formation of new chemical bonds and the passivation of unsatisfied chemical bonds will strongly affect the luminescence. For example when hydrogen diffuses into the substrate it will bond to unsatisfied Si bonds resulting in formation of e.g. —Si—H, —Si—O—Si— or —Si—O—H. The inventors conclude that the enhancement of the luminescence intensity due to the inclusion of hydrogen, reported above, may not be restricted to this chemical species, and believe that the highly reactive, high electronegative impurity fluorine may have a beneficial effect on the observed luminescence.

We claim:

1. A process for forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a sufficient time to bring about precipitation of silicon nanocrystals dispersed through the $SiO_2$ substrate, said crystals exhibiting photoluminescence and/or electroluminescence, and said process being characterized in that silicon ions are implanted at an energy of at least 100 keV and at a dose of from $1\times10^{17}/cm^2$ to less than that required to produce sputter-limited saturation, whereby there is produced a silicon material which is capable of producing photoluminescence and/or electroluminescence.

2. A process according to claim 1, wherein the silicon ions are implanted as an energy of about 200 keV.

3. The process of claim 1, wherein the implantation step comprises a first stage in which silicon ions are implanted into the $SiO_2$ substrate at a first energy and subsequent implantation stages in which the silicon ions are implanted into said substrate at other energies different from the first energy.

4. The process of claim 3 in which one implantation stage is carried out at an energy of about 150 keV and the other implantation stage is carried out at an energy of about 200 keV.

5. The process of claim 1, wherein the substrate is annealed at a temperature of 900° to 1300° C.

6. The process of claim 1, wherein the substrate is annealed for a period of 15 minutes to 6 hours.

7. The process of claim 1, wherein the substrate is annealed in an atmosphere of nitrogen gas.

8. A process of claim 1, wherein further annealing is carried out in the presence of hydrogen that modifies the microcrystals to cause them to exhibit increased luminescence.

9. A process of forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a period sufficient time to bring about precipitation of silicon nanocrystals dispersed through the $SiO_2$ substrate and capable of exhibiting photoluminescence and/or electroluminescence, the process being characterized in that the thickness of the silicon dioxide layer is more than 100 nm–500 nm and the silicon dioxide layer is implanted with ions having an energy of at least 100 keV which is sufficient to penetrate the $SiO_2$ layer with a projection range equal to or more than half the thickness of the $SiO_2$ layer whereby there is produced a silicon material containing Si nanocrystals having an average particle size of about 30 Å which is capable of producing photoluminescence and/or electroluminescence.

10. The process of claim 8, wherein the hydrogen is present as a component of forming gas.

11. The process of claim 8, wherein the further annealing is carried out at a temperature from more than 400° C. to 1100° C.

12. The process of claim 8, wherein the further annealing is carried out for at least 1 hour.

13. The process of claim 1, wherein the $SiO_2$ is produced by oxidation of the surface of a silicon wafer.

14. The process of claim 1, wherein the $SiO_2$ is prepared in the form of a quartz plate.

15. A process for forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a period sufficient time to bring about precipitation of silicon nanocrystals dispersed through the substrate and capable of producing photoluminescence and/or electroluminescence, the process being characterized in that silicon ions are implanted at a dose of from $1\times10^{17}/cm^2$ to less than that required to produce saturation and at an energy of at least 100 keV, and in that the thickness of the layer is more than 100 nm and the projection range or ranges of the implanted ions are chosen so that all the silicon is deposited in the oxide layer at a depth or depths with a projected range which is greater than three times the standard deviation of the range whereby there is produced a silicon material containing Si nanocrystals having an average particle size of about 30 Å which is capable of producing photoluminescence and/or electroluminescence.

16. A process for forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a period sufficient to bring about precipitation of silicon nanocrystals dispersed through the $SiO_2$ substrate, said crystals exhibiting photoluminescence and/or electroluminescence, and said process being characterized in that silicon ions are implanted at an energy of at least 100 keV and at a dose of from $1\times10^{17}/cm^2$ to less than that required to produced sputter-limited saturation, whereby there is produced a silicon material containing Si nanocrystals having an average particle size of about 30 Å which is capable of producing photoluminescence and/or electroluminescence.

17. A process of forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a period sufficient to bring about precipitation of silicon nanocrystals dispersed through the $SiO_2$ substrate and capable of exhibiting photoluminescence and/or electroluminescence, the process being characterized in that the thickness of the silicon dioxide layer is more than 100 nm–500 nm and the silicon dioxide layer is implanted with ions having an energy of at least 100 keV which is sufficient to penetrate the $SiO_2$ layer with a projection range equal to or more than half the thickness of the SiO layer, whereby there is produce a silicon material which is capable of producing photoluminescence and/or electroluminescence.

18. A process for forming a luminescent silicon material which comprises the steps of implanting silicon ions into a silicon oxide ($SiO_2$) substrate, and annealing the substrate at an elevated temperature in an atmosphere comprising at least one of hydrogen and nitrogen for a period sufficient to bring about precipitation of silicon nanocrystals dispersed through the substrate and capable of producing photoluminescence and/or electroluminescence, the process being characterized in that silicon ions are implanted at a dose of from $1\times10^{17}/cm^2$ to less than that required to produce saturation and at an energy of at least 100 keV, and in that the thickness of the layer is more than 100 nm and the projection range or ranges of the implanted ions are chosen so that all of the silicon is deposited in the oxide layer at a depth or depths with a projected range which is greater than three times the standard deviation of the range, whereby there is produced a silicon material which is capable of producing photoluminescence and/or electroluminescence.

19. The process of claim 18, in which the thickness of the silicon dioxide layer is about 500 nm and the projection range of the silicon ions is about 300 nm.

* * * * *